United States Patent [19]

Kawashima

[11] 4,112,323
[45] Sep. 5, 1978

[54] CIRCULAR FLEXURAL MODE PIEZOELECTRIC VIBRATOR WITH INTEGRAL SUPPORT ARMS

[75] Inventor: Hirofumi Kawashima, Tokyo, Japan

[73] Assignee: Kabushiki Kaisha Daini Seikosha, Japan

[21] Appl. No.: 763,712

[22] Filed: Jan. 28, 1977

[30] Foreign Application Priority Data

Jan. 29, 1976 [JP] Japan .................................. 51-8633
Feb. 13, 1976 [JP] Japan .................................. 51-14690

[51] Int. Cl.² .......................................... H01L 41/10
[52] U.S. Cl. .................................. 310/348; 310/346; 310/366; 310/369
[58] Field of Search ................................ 310/369, 366

[56] References Cited

U.S. PATENT DOCUMENTS

| Re. 26,707 | 11/1969 | Cutler et al. ..................... | 310/361 X |
| 1,930,536 | 10/1933 | Piersol ............................. | 310/366 X |
| 2,472,179 | 6/1949 | Tibbetts .......................... | 310/366 X |
| 2,967,957 | 1/1961 | Massa .............................. | 310/366 X |
| 2,994,791 | 8/1961 | Shinada et al. ................. | 310/369 X |
| 3,408,515 | 10/1968 | Morse .............................. | 310/366 X |
| 3,488,530 | 1/1970 | Staudte ............................ | 310/348 |
| 3,617,780 | 11/1971 | Benjaminson ................... | 310/361 X |
| 3,909,641 | 9/1975 | Ohshima et al. ................ | 310/366 |

Primary Examiner—Mark O. Budd
Attorney, Agent, or Firm—Robert E. Burns; Emmanuel J. Lobato; Bruce L. Adams

[57] ABSTRACT

A piezoelectric flexural vibrator comprises a circular or polygonal disc of piezoelectric crystal such as quartz, lithium tantalate or lithium niobate which is formed by chemical etching and is supported around its periphery with electrodes on opposite faces comprising a pair of electrodes each of which is divided into two portions of which one is on one face of the disc and the other is on the opposite face of the disc. By reason of its small size — 25 to 150 microns thick and less than 10mm across — and its good frequency-temperature characteristics, the vibrator is suitable for use in wristwatches.

6 Claims, 7 Drawing Figures

CIRCULAR FLEXURAL MODE PIEZOELECTRIC VIBRATOR WITH INTEGRAL SUPPORT ARMS

FIELD OF INVENTION

This invention relates to a flexural mode piezoelectric crystal vibrator of a disc type and in particular to a disc type vibrator having improved frequency-temperature characteristics.

BACKGROUND OF INVENTION

A quartz crystal vibrator of the tuning fork type having a frequency of 32,768Hz is generally used for electronic time pieces. This frequency is decided by the present level of conventional IC-technique. The tuning fork vibrator is selected because of the ease of supporting a tuning fork vibrator by it's stem without lowering the quality of the vibrator.

However as calculated threoretically a vibrator of the tuning fork type has a frequency-temperature characteristic which is approximately a parabolic curve and the parabolic coefficient of the vibrator is large. It is therefore difficult to provide a high accuracy quartz crystal wristwatch. In order to provide a high accuracy quartz crystal wristwatch it is necessary to improve the frequency-temperature characteristic of the vibrator and it is then difficult to make AT cut quartz crystal vibrator of a small size which has a good frequency-temperature characteristic. It is therefore impossible at present to use it in a wristwatch. The development of SOS-IC is well advanced but it is of no practical use in a wristwatch.

A tuning fork type quartz crystal vibrator is generally supported by the stem portion which is ridgedly secured to a support member. When the vibrator is subjected to shock the displacement of the tines of the vibrator is very large and therefore the tines of the vibrator may chip off.

SUMMARY OF INVENTION

It is an object of the present invention to overcome the disadvantages and insufficiencies of prior vibrators as pointed out above and to provide a piezoelectric flexural vibrator which is of small size and has good frequency-temperature characteristics so as to make it suitable for use in a wristwatch.

In accordance with the present invention there is provided a piezoelectric flexural vibrator which comprises a generally circular disc of piezoelectric crystal which is supported around its periphery and has electrodes disposed on opposite faces of the disc. The term "generally circular" is herein used in a generic sense to inlcude discs of circular, oval or polygonal shape. The electrodes preferrably comprise a pair of electrodes, each of which is divided into two portions of which one portion is disposed on one face of the disc of piezoelectric crystal while the other portion is disposed on the opposite face. In accordance with the invention it is possible to produce a piezoelectric crystal vibrator which has a thickness of 25 to 150 microns and is less than 10mm across and which has good frequency-temperature characteristics. It is therefore eminently suitable for use in electronic wristwatches.

The nature, objects and advantages of the invention will be more fully understood from the following description of preferred embodiments illustrated by way of example in the accompanying drawings in which:

FIG. 1A is an enlarged schematic plan view of a piezoelectric vibrator in accordance with the present invention, FIG. 1B is a side view of the piezoelectric vibrator shown in FIG. 1A, FIGS. 2, 3, and 4 are enlarged schematic plan views illustrating modifications, FIG. 5 is a schematic sectional view of a disc type quartz crystal vibrator in accordance with the invention showing direction of the electric field thereof and the vibratory direction and FIG. 6 is a graph showing a conventional frequency-temperature characteristic and the frequency-temperature characteristic according to the present invention.

DESCRIPTION OF PREFERRED EMBODIMENTS

Figure 1A:
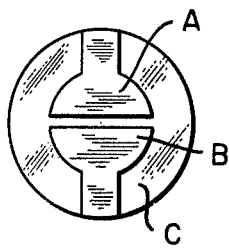
Figure 1B:
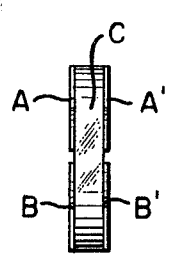

One embodiment of a disc type piezoelectric vibrator in accordance with the present invention is shown in FIGS. 1A and 1B. In FIG. 1A the shape of the vibrator is shown as being circular but it will be understood that it may also be oval or polygonal in accordance with the present invention.

The quartz crystal vibrator is cut from a plate of quartz crystal material in a similar manner to the conventional quartz crystal vibrator. In FIGS. 1A and 1B a quartz crystal vibrator C is shown provided with a plurality of electrodes A, A', B and B'. The electrodes A, B' are electrically connected via the side of the quartz crystal vibrator or by means of a through hole and the electrodes A', B are also connected in the same manner as the electrodes A, B'. Thus each of the electrodes in effect comprises a pair of electrodes each of which is divided into two portions. In order to obtain the maximum energy of the electrode field, the electrodes A, A' are generally disposed symmetrically and also the electrodes B, B' are disposed symmetrically.

Figure 2:
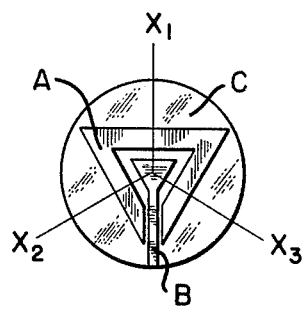
Figure 3:
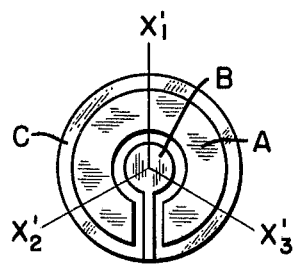

Instead of the electrodes being approximately semicircular as shown in FIG. 1A they may be of other shape as illustrated by way of example in FIGS. 2 and 3. Thus for example in FIG. 2 the electrode A is shown as being in the shape of a hollow triangle which substantially surrounds electrode B in the shape of a small triangle. In FIG. 3 electrode A is shown as being in the shape of a ring which substantially surrounds electrode B in the shape of a circle. As in the case of the vibrator shown in FIGS. 1A and 1B, electrodes are arranged in the same manner on opposite faces of the vibrators shown in FIGS. 2 and 3. $X_1$, $X_2$, $X_3$, $X'_1$, $X'_2$ and $X'_3$ show the eletrical axes respectively in FIGS. 2 and 3.

Figure 4:
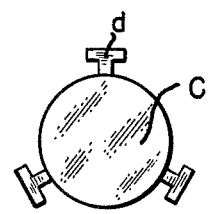

The quartz crystal discs of the vibrators in accordance with the present invention are supported at their periphery either continuously or at a plurality of points around the periphery. In FIG. 4 there is shown a quartz crystal vibrator C which is provided on its periphery with a plurality of projections $d$ which are integral with the body of the vibrator. The projections $d$ of the quartz crystal vibrator C are secured to support members by adhesive or solder. By supporting the vibrator in this manner the energy loss of the vibrator is minimized. It will be understood that the vibrator of FIG. 4 has electrodes (not shown) on opposite faces as in the case of the vibrators of FIGS. 1A, 1B, 2 and 3.

Figure 5:
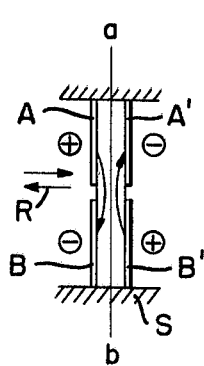

The principle of excitation and support method of the quartz crystal vibrator according to the present invention is illustrated in FIG. 5. As indicated in FIG. 5 the periphery of the circular quartz crystal vibrator is secured to a support member S, for example by adhesive or solder. The circular quartz crystal vibrator may be secured to a support member continuously throughout its periphery or the circular quartz crystal vibrator may be secured to a plurality of support members disposed around the periphery thereof. When the quartz crystal vibrator is provided on its periphery with a plurality of projections as illustrated by way of example in FIG. 4 these projections are secured by adhesive or solder to the support member or members.

When positive and negative voltages are applied to the electrodes A and B respectively, the electrode A being electrically connected to the electrode B' and the electrode B being connected to the electrode A', electric fields are generated in the circular quartz crystal material as indicated by arrows in FIG. 5. In comparison with the left-hand portion and the right-hand portion of the sectional view of a circular quartz crystal vibrator as shown in FIG. 5 these electric fields are generated in opposite directions. Assuming that the left-hand portion generates extentional strains, the right-hand portion generates opposite strains. If therefore an alternating current is applied across the electrodes A, B, the circular quartz crystal vibrator will perform symmetrical flexural vibrations in the directions indicated by the arrows R in FIG. 5. The vibration of the quartz crystal vibrator is made possible in an oscillating circuit.

The frequency of the quartz crystal vibrator according to the present invention is expressed as follows:

$$f = (ans/R^2) D/\rho$$

where, $ns$: constant
$\rho$: density
$R$: A radius of a circular disk
$D$: bending stiffness (which is a function of thickness $t$)

Thus the frequency of the circular disc quartz crystal vibrator is determined by the radius and the thickness of the disc. Accordingly it is possible to choose freely a suitable frequency of the quartz crystal vibrator by changing the dimensions thereof. A quartz crystal vibrator according to the present invention can therefore be made small by making the radius small. For example the diameter of the quartz crystal disc may be 10mm or less while the thickness is within the range of 25 to 150 microns.

By advanced IC-techniques a quartz crystal vibrator having a frequency of hundreds of KHz for use in wristwatches can be made by using masking-techniques and chemical etching. Conventionally, the resist material generally used is not good so that the thickness of chemical etching is limited to about 100 microns. By improving the resist material and selecting other resist materials, a quartz crystal vibrator having a thickness of 150 microns or more can be formed by chemical etching.

Figure 6:
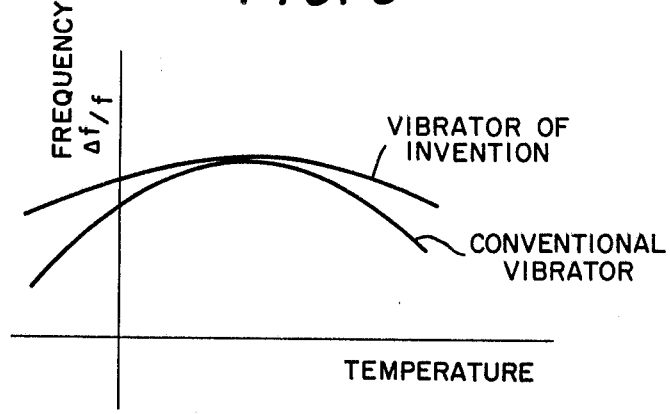

If the quartz crystal vibrator is smaller than 10mm in dimension, it is possible to use such a vibrator in wristwatches. The frequency-temperature characteristics of quartz crystal vibrators in accordance with the present invention compared with conventionally frequency-temperature characteristics is shown in FIG. 6. by reference to FIG. 6 it will be seen that the frequency-temperature characteristic of vibrators in accordance with the invention is good in comparison with the frequency-temperature characteristics of conventional tuning fork type vibrators.

It will thus be seen that acording to the present invention, a quartz crystal vibrator having good frequency-temperature characteristics is provided by a circular or polygonal quartz crystal vibrator supported at its periphery and moreover that a low cost quartz crystal vibrator is provided by using chemical etching. techniques.

The present invention is not limited to quartz crystal vibrators as it is applicable to all piezoelectric crystals, for example lithium tantalate and lithium niobate. As will be recognized by those skilled in the art, many variations and modifications can be made and hence the invention is in no way limited to the illustrated embodiments.

What I claim is:

1. A piezoelectric flexural mode vibrator comprising a thin flat plate of piezoelectric crystal having a uniform thickness of 25 to 150 microns and having peripheral edges chemically etched to define a generally circular disc less than 10mm. across and a plurality of circumferentially spaced integral support portions projecting from the periphery of said disc and constituting the outermost portions of said plate, said support portions having outer edge surfaces for bonding to a support surface and a pair of electrodes applied directly to opposite faces of said disc, each of said electrodes comprising two electrically connected portions of which one portion is disposed on one face of said disc and the other portion is disposed on the opposite face of the disc, each portion of each of said electodes being disposed opposite a corresponding portions of the other electrode on the opposite face of the disc for excitation of said disc in the flexural mode of vibration.

2. A piezoelectric flexural mode vibrator according to claim 1, in which a portion of one of said electrodes is centrally located on one face of the diisc and is substsntially surrounded by a portion of the other of said electrodes.

3. A piezoelectric flexural mode vibrator according to claim 2, in which said crystal has $X_1$, $X_2$ and $X_3$ axes converging centrally of said disc and disposed at approximately 120° to one another, and in which said centrally located electrode portion is triangular and said surrounding electrode portion is a hollow triangle, the sides of said triangles being bisected by said axes.

4. A peizoelectric flexural mode vibrator according to claim 1, in which there are three of said support portions disposed at appromximately 120° to one another.

5. A piezoelectric flexural mode vibrator according to claim 1, in which each of said support portions is generally T-shaped with a wider outer portion and a narrower stem portion connecting said outer portion with said generally circular disc portion.

6. A piezoelectric flexural mode vibrator according to claim 1, in which said piezoelectric plate is of a material selected from the group consisting of quartz crystal, lithuim tantalate and lithuim miobate.

* * * * *